(12) United States Patent
Sugiura

(10) Patent No.: US 10,132,652 B2
(45) Date of Patent: Nov. 20, 2018

(54) ELECTROSTATIC SENSOR

(71) Applicant: AISIN SEIKI KABUSHIKI KAISHA, Kariya-shi (JP)

(72) Inventor: Takehiko Sugiura, Kariya (JP)

(73) Assignee: AISIN SEIKI KABUSHIKI KAISHA, Kariya-shi (JP)

( * ) Notice: Subject to any disclaimer, the term of this patent is extended or adjusted under 35 U.S.C. 154(b) by 27 days.

(21) Appl. No.: 15/165,696

(22) Filed: May 26, 2016

(65) Prior Publication Data
US 2016/0349300 A1    Dec. 1, 2016

(30) Foreign Application Priority Data

May 28, 2015   (JP) ................................ 2015-108648

(51) Int. Cl.
| *G01R 27/26* | (2006.01) |
|---|---|
| *G01D 5/24* | (2006.01) |
| *G06F 3/044* | (2006.01) |
| *H01H 36/00* | (2006.01) |

(52) U.S. Cl.
CPC .......... *G01D 5/2405* (2013.01); *G06F 3/044* (2013.01); *H01H 36/00* (2013.01)

(58) Field of Classification Search
USPC .............................. 345/173, 174; 702/47, 52
See application file for complete search history.

(56) References Cited

U.S. PATENT DOCUMENTS

| 7,911,321 | B2 * | 3/2011 | Bingle | E05B 81/76 |
| | | | | 340/5.54 |
| 8,115,499 | B2 * | 2/2012 | Osoinach | H03K 17/9622 |
| | | | | 324/662 |
| 9,476,243 | B2 * | 10/2016 | Wuerstlein | E05F 15/60 |
| 9,477,003 | B2 * | 10/2016 | Pribisic | G01R 27/02 |
| 2003/0085679 | A1 * | 5/2003 | Bledin | E05F 15/46 |
| | | | | 318/264 |
| 2011/0273375 | A1 * | 11/2011 | Wilford | H03K 17/962 |
| | | | | 345/173 |
| 2012/0092295 | A1 * | 4/2012 | Hirai | G06F 3/044 |
| | | | | 345/174 |
| 2012/0133159 | A1 * | 5/2012 | Tateishi | E05B 81/77 |
| | | | | 292/336.3 |
| 2013/0063394 | A1 * | 3/2013 | Wakuda | G06F 3/044 |
| | | | | 345/174 |
| 2014/0374232 | A1 * | 12/2014 | Hanada | H01H 9/161 |
| | | | | 200/600 |

(Continued)

FOREIGN PATENT DOCUMENTS

| JP | 2013-106308 | 5/2013 |
| JP | 2014-61753 | 4/2014 |
| JP | 2014-123434 | 7/2014 |

*Primary Examiner* — Patrick Assouad
*Assistant Examiner* — Demetrius Pretlow
(74) *Attorney, Agent, or Firm* — Oblon, McClelland, Maier & Neustadt, L.L.P.

(57) ABSTRACT

An electrostatic sensor includes: a decoration portion formed of a metal-based material, which is provided in an attachment target member; and a plurality of electrodes that are arranged in a back portion of the decoration portion and that individually detect a detection target which comes into contact with or approaches the decoration portion, wherein the decoration portion is configured of a plurality of decoration pieces divided according to arrangement of the plurality of electrodes.

5 Claims, 5 Drawing Sheets

(56) References Cited

U.S. PATENT DOCUMENTS

| | | | |
|---|---|---|---|
| 2016/0178276 A1* | 6/2016 | Park | F25D 29/005 345/173 |
| 2016/0214525 A1* | 7/2016 | Sheehan | B60Q 1/0023 |

* cited by examiner

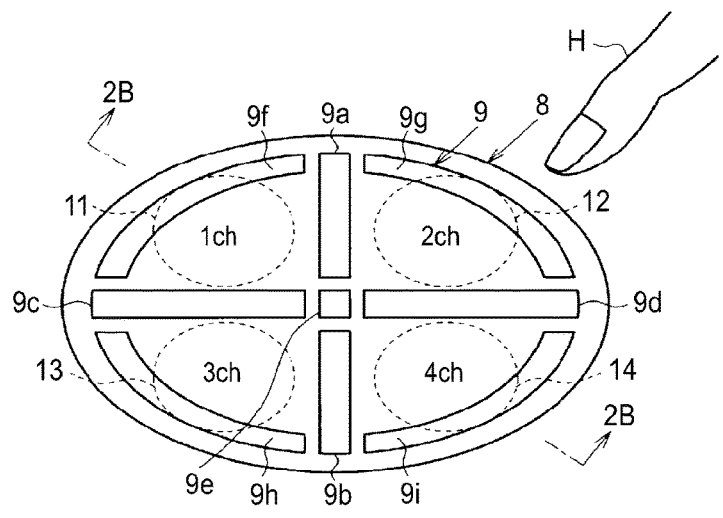
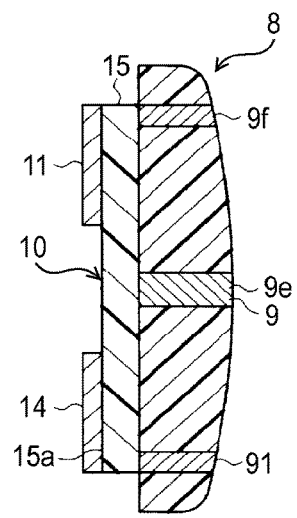
FIG.2A  FIG.2B
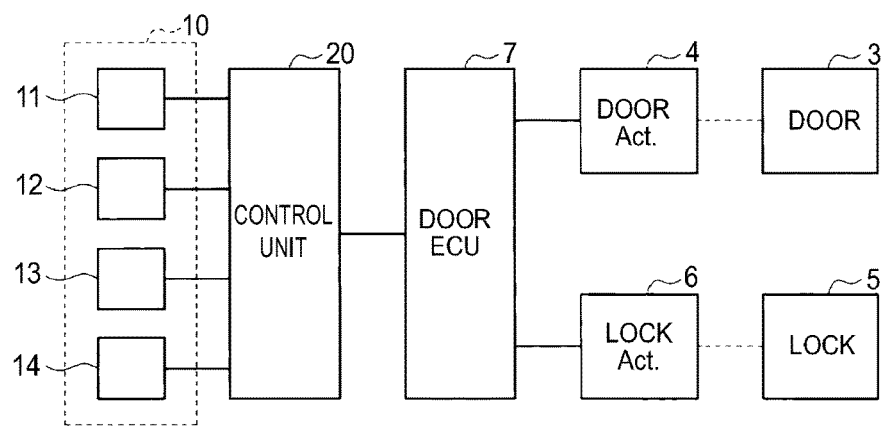
FIG.3

ELECTROSTATIC SENSOR

CROSS REFERENCE TO RELATED APPLICATIONS

This application is based on and claims priority under 35 U.S.C. § 119 to Japanese Patent Application 2015-108648, filed on May 28, 2015, the entire contents of which are incorporated herein by reference.

TECHNICAL FIELD

This disclosure relates to an electrostatic sensor including a plurality of electrodes that can individually detect a detection target in a non-contact state.

BACKGROUND DISCUSSION

In the related art, various electrostatic sensors have been proposed (for example, JP 2014-61753 (Reference 1) or the like).

In such an electrostatic sensor, for example, in terms of external appearance, it is considered that a plurality of electrodes are concealed in a back portion of a decoration portion of an attachment target member. In this case, the plurality of electrodes are widened toward the decoration portion as a whole.

In a case where the decoration portion is formed of a material such as metal or a high dielectric constant resin (hereinafter, referred to as a "metal-based material"), the plurality of electrodes are likely to be joined through the decoration portion therebetween, and thus it is likely to have remarkably low detection sensitivity of the respective electrodes to a detection target. As a result, there is a possibility that it is not possible to identify which electrode of the plurality of electrodes detects the detection target.

SUMMARY

Thus, a need exists for an electrostatic sensor which is not susceptible to the drawback mentioned above.

An electrostatic sensor according to an aspect of this disclosure includes: a decoration portion formed of a metal-based material, which is provided in an attachment target member; and a plurality of electrodes that are arranged in a back portion of the decoration portion and that individually detect a detection target which comes into contact with or approaches the decoration portion. The decoration portion is configured of a plurality of decoration pieces divided according to arrangement of the plurality of electrodes.

BRIEF DESCRIPTION OF THE DRAWINGS

The foregoing and additional features and characteristics of this disclosure will become more apparent from the following detailed description considered with the reference to the accompanying drawings, wherein:

FIG. 2A is a front view illustrating a structure of the electrostatic sensor of the embodiment, and FIG. 2B is a sectional view taken along line 2B-2B in FIG. 2A;

FIG. 3 is a block diagram illustrating an electrical configuration in the electrostatic sensor of the embodiment;

DETAILED DESCRIPTION

First Embodiment

Hereinafter, a first embodiment of an electronic sensor will be described.

Figure 1:
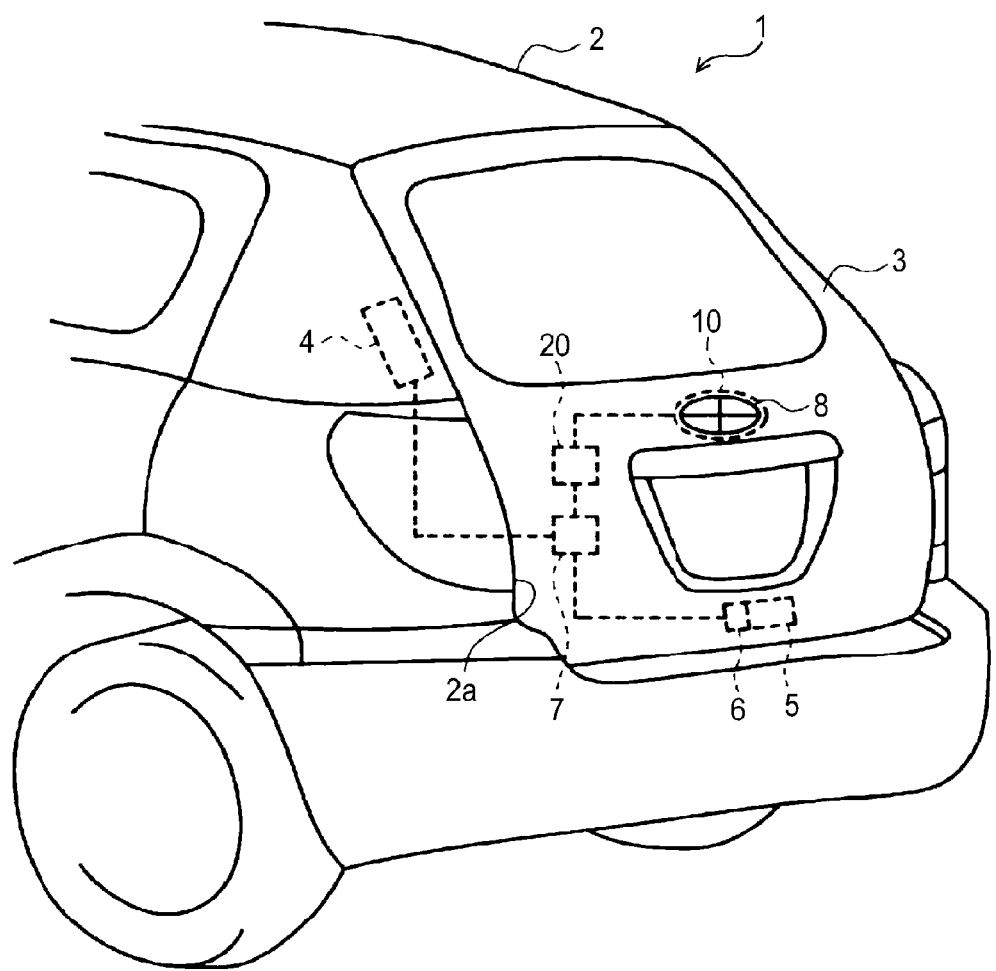
FIG. 1 is a perspective view illustrating a vehicle to which a first embodiment of an electrostatic sensor is applied.

As illustrated in FIG. 1, an opening 2a is formed at a rear section of a body 2 of a vehicle 1 such as an automobile. In addition, at the rear section of the body 2, a back door 3 is attached in an openable and closable manner via a door hinge (not illustrated) provided in the upper portion of the opening 2a. The back door 3 is opened by being pushed upward around the hinge.

A door drive unit 4 is disposed at the rear section of the body 2. The door drive unit 4 is configured of, as a main member, an electrical drive source such as an electric motor, and is mechanically linked with the back door 3 via an appropriate door drive mechanism, thereby driving the back door 3 to be opened and closed. In addition, a door lock 5 which locks or unlocks the back door 3 which is in a closed state, and a door lock drive unit 6 are disposed on a front end of the back door 3 on the inside of the vehicle interior. The door lock drive unit 6 is configured of, as a main member, an electrical drive source such as an electric motor, and is mechanically linked with the door lock 5 via an appropriate lock drive mechanism, thereby driving the door lock 5 so as to be locked or unlocked.

Both the door drive unit 4 and the door lock drive unit 6 are electrically connected to a door electronic control unit (ECU) 7 configured of a microcomputer (MCU), and are individually controlled to be driven by the door ECU 7.

A mark 8 such as a company name is disposed at the center on the outer surface of the back door 3, and a substantially elliptical plate-shaped sensor body 10 is disposed in a back portion of the mark 8. Since the sensor body 10, for example, detects a user's finger as a detection target body that comes into contact with or approaches the mark 8, the sensor body is electrically connected to a control unit 20 configured of, for example, the MCU. The control unit 20 is also electrically connected to the door ECU 7.

As illustrated in FIGS. 2A and 2B, in the mark 8 as an attachment target member is formed of, for example, a resin material to have a substantially elliptical plate shape, and a decoration portion 9, which is formed of a metal material and has a substantial sun cross (a cross inside an ellipse) shape, is embedded. Further, the decoration portion 9 is divided into a plurality of pieces, and has a pair of upper and lower decoration pieces 9a and 9b, a pair of right and left decoration pieces 9c and 9d, and a center decoration piece 9e, which draw a cross of the substantial sun cross, and has four substantial-arcuate decoration pieces 9f, 9g, 9i, and 9h, which draws an ellipse of the substantial sun cross, in order from the upper left in a clockwise direction in the drawing.

Meanwhile, the sensor body 10 has a substantially elliptical plate-shaped insulation substrate 15 formed of, for example, a glass epoxy substrate. The sensor body 10 is fixed to the back portion of the decoration portion 9 (mark 8) in the insulation substrate 15. The insulation substrate 15 extends to face the mark 8 in a state that a major axis direction and a minor axis direction the insulation substrate 15 respectively extend in a width direction and in a height direction of a vehicle. In other words, an outer circumference on the principal surface of the insulation substrate 15 on the decoration pieces side is formed substantially along an outer circumference of the decoration portion 9 (decoration pieces 9f to 9i).

Four substantially elliptical plate-shaped electrodes 11, 12, 13, and 14 are formed on the inner circumference side of the decoration pieces 9f to 9i on a back surface 15a as the side of the insulation substrate 15, which is separated from the mark 8. The four electrodes 11 to 14 configure 1 ch (channel) to 4 ch (channel). The electrodes 11 to 14 of the respective chs cause capacitance exhibited in cooperation with a user's finger H approaching the electrodes to change.

The four electrodes 11 to 14 are arranged in a state of occupying spaces formed by projection of the four decoration pieces 9f to 9i, respectively, in a plate thickness direction, and are closely capacitive-coupled with the decoration pieces 9f to 9i, respectively. Specifically, the electrode 11, for example, is closely capacitive-coupled with the decoration pieces 9f, but capacitive coupling of the electrode with the other decoration pieces 9g to 9i is relatively low.

In addition, the respective electrodes 11 to 14 are arranged in a state of not occupying the space formed by projection of the four decoration pieces 9a to 9e in the plate thickness direction, and thus capacitive coupling of the electrodes with the other decoration pieces 9a to 9e is relatively low. In other words, the occurrence of capacitive coupling of each of the electrodes 11 to 14 with another electrode of the electrodes 11 to 14 via the decoration pieces 9a to 9e is reduced.

In other words, the decoration portion 9 is divided such that each of the decoration pieces 9a to 9i does not extend across any of the four electrodes 11 to 14.

As illustrated in FIG. 3, the electrodes 11 to 14 are connected to the control unit 20. The control unit 20 outputs an oscillation signal to each of the electrodes 11 to 14, thereby causing the electrode to output a detection signal [V] having a voltage level depending on the capacitance. The control unit 20 inputs the detection signal, thereby detecting a user's finger H that approaches each of the electrodes 11 to 14.

Here, a user performs an operation with the finger H that comes into contact with or approaches the mark 8, thereby achieving an operation on a target object, which the user wants to perform. In other words, the user's finger H comes into contact with or approaches the mark 8, and thereby detection signals from the four electrodes 11 to 14 are changed. For example, in a case where the user's finger H comes into contact with or approaches an upper left portion of the mark 8, a level of the detection signal from the electrode 11 is increased. The same is true of the other electrodes 12 to 14. The control unit 20 detects an operation on a target object, which the user wants to achieve, based on the change in the level of the detection signal, that is, based on the position of the mark 8 which the user's finger H comes into contact with or approaches. Then, the control unit 20 performs output processing corresponding to the detected operation.

For example, operations of coming into contact with or approaching the upper left portion and the upper right portion of the mark 8 by the user's finger H correspond to operations of opening actuation and closing actuation of the back door 3, respectively. In addition, operations of coming into contact with or approaching the lower left portion and the lower right portion of the mark 8 by the user's finger H correspond to operations of locking actuation and unlocking actuation of the door lock 5, respectively. In this case, for example, when the level of the detection signal of the electrode 11 increases and exceeds a predetermined upper-limit threshold level, the control unit 20 determines that the user's finger H comes into contact with or approaches the upper left portion of the mark 8, and outputs, to the door ECU 7, an operation signal indicating that the back door 3 is subjected to the opening actuation. At this time, it is needless to say that the door ECU 7 controls driving of the door drive unit 4 which performs the opening actuation of the back door 3. Even in cases where the user's finger H comes into contact or approaches the other portions of the mark 8, the procedure is the same as above except that the target object is different.

As described above, according to the present embodiment, it is possible to achieve the following effects.

(1) In the present embodiment, the decoration portion 9 is divided such that each of the decoration pieces 9a to 9i does not extend across any of the four electrodes 11 to 14, thereby making it possible to reduce the occurrence of joining of the plurality of electrodes 11 to 14, and thus making it possible to reduce the occurrence of having low detection sensitivity of the respective electrodes 11 to 14 to the user's finger H. Hence, it is possible to reliably identify which electrode of the plurality of electrodes 11 to 14 detects the user's finger H.

(2) In the present embodiment, the respective electrodes 11 to 14 can detect the user's finger H in cooperation with the corresponding decoration pieces 9f to 9i which are strongly capacitive-coupled therewith. In this manner, it is possible to enhance the detection sensitivity of the respective electrodes 11 to 14 (and the decoration pieces 9f to 9i) to the user's finger H. In particular, the respective decoration pieces 9f to 9i are embedded in the mark 8 in a state of being exposed through a front surface of the mark 8, thereby making it possible to reduce a detection distance loss by the thickness of the mark 8, and making it possible to enhance the detection sensitivity of the respective electrodes 11 to 14. In addition, since it is possible to reduce the detection distance loss even when the mark 8 is thick, it is possible to enhance flexibility in design.

(3) In the present embodiment, when the decoration portion is divided according to arrangement of the plurality of electrodes 11 to 14, the decoration portion 9 can be formed to have any shape, and it is possible to enhance flexibility in design.

(4) In the present embodiment, the decoration portion 9 is embedded in the mark 8, thereby making it possible to prevent the insulation substrate 15 (sensor body 10) from being exposed from a portion in which the decoration portion 9 is not formed, and making it possible to improve an external appearance thereof.

(5) In the present embodiment, in the mark 8, even when the portion, in which the decoration portion 9 is not formed, is formed of a resin material (except for a metal-based material) and the sensor bodies 10 (electrodes 11 to 14) are arranged on the back portion of the mark, it is possible to detect the user's finger H.

(6) In the present embodiment, the plurality of electrodes 11 to 14 are arranged on and fixed to the insulation substrate 15, thereby making it possible to reinforce the electrodes 11 to 14.

(7) In the present embodiment, the plurality of chs of electrodes 11 to 14 are provided, thereby making it possible to set a plurality of types of operations. Then, the target object can be subjected to various types of actuation by the plurality of types of set operations.

In addition, in order to increase the number of types of settable operations, a complicated electrical configuration (including control) like an X-Y electrode may not be formed, and it is possible to realize space saving or cost saving.

(8) In the present embodiment, the detection can be performed in a state in which the user's finger H does not come into contact with the sensor body by using the change in capacitance obtained by the sensor bodies 10 (electrodes 11 to 14) and the user's finger H.

Second Embodiment

Hereinafter, the second embodiment of the electrostatic sensor will be described. Further, since the second embodiment has a configuration in which the decoration portion and the electrodes of the first embodiment are electrically connected (short-circuited), detailed description about the same components as in the first embodiment is omitted.

Figure 4A:
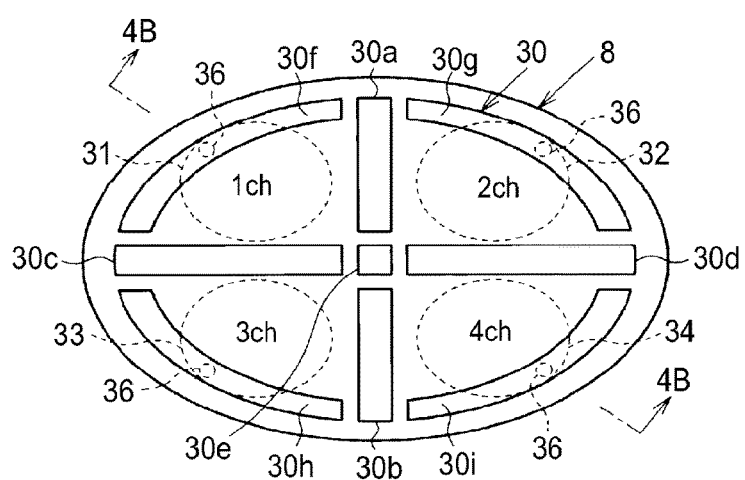
FIG. 4A is a front view illustrating a structure of an electrostatic sensor of a second embodiment.
Figure 4B:
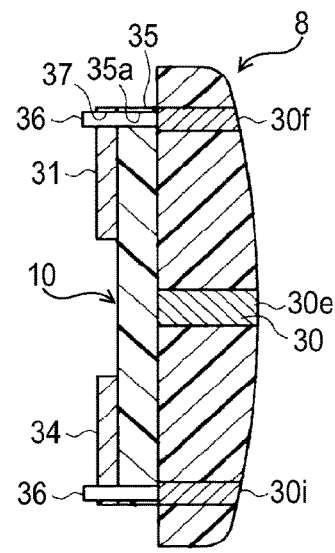
FIG. 4B is a sectional view taken along line 4B-4B in FIG. 4A.

As illustrated in FIGS. 4A and 4B, a decoration portion 30 corresponding to the decoration portion 9 of the first embodiment is formed of, for example, a metal material, and has decoration pieces 30a, 30b, 30c, 30d, 30e, 30f, 30g, 30h, and 30i corresponding to decoration pieces 9a to 9i. Meanwhile, four electrodes 31, 32, 33, and 34 corresponding to the electrodes 11 to 14 are formed on an insulation substrate 35 corresponding to the insulation substrate 15. Terminals 36 made of a conductor such as copper wires are provided to project from the decoration pieces 30f to 30i, respectively, toward the insulation substrate 35. Meanwhile, insertion holes 35a are formed in the insulation substrate 35 so as to open concentrically to the terminals 36 in the plate thickness direction thereof, respectively, and insertion holes 37 are formed in the electrodes 31 to 34, respectively, so as to open concentrically to the terminals 36 of the adjacent corresponding decoration pieces 30f to 30i. The terminals 36 of the decoration pieces 30f to 30i penetrate through the corresponding insertion holes 35a and 37, and are short-circuited from the respective electrodes 31 to 34 on the tips thereof by soldering or the like. In other words, the respective decoration pieces 30f to 30i and the respective electrodes 31 to 34, which are short-circuited from the decoration pieces, are considered one conductor as a whole.

As described above, according to the present embodiment, the following effects are obtained, in addition to the effects (1), and (3) to (8) in the first embodiment.

(1) In the present embodiment, the respective electrodes 31 to 34 can detect the user's finger H in cooperation with the corresponding decoration pieces 30f to 30i which are short-circuited from the electrodes. In this manner, it is possible to enhance the detection sensitivity of the respective electrodes 31 to 34 (and the decoration pieces 30f to 30i) to the user's finger H. In particular, the respective decoration pieces 30f to 30i are embedded in the mark 8 in a state of being exposed through a front surface of the mark 8, thereby making it possible to reduce a detection distance loss by the thickness of the mark 8, and making it possible to further enhance the detection sensitivity of the respective electrodes 31 to 34. Otherwise, the respective decoration pieces 30f to 30i are short-circuited from the corresponding electrodes 31 to 34 via the terminals 36 that penetrate through the insulation substrate 35, thereby making it possible to reduce the detection distance loss by the thickness of the insulation substrate 35, and making it possible to further enhance the detection sensitivity of the respective electrodes 31 to 34.

(2) In the present embodiment, the respective electrodes 31 to 34 are integrated with the mark 8 (decoration pieces 30f to 30i) via the terminals 36, thereby making it possible to omit the insulation substrate 35. In this case, the respective electrodes 31 to 34 can be close to the mark 8, then it is possible to reduce the detection distance loss by the amount of the separated distance from the mark 8, and it is possible to further enhance the detection sensitivity of the respective electrodes 31 to 34. Otherwise, it is possible to miniaturize the electrostatic sensor (sensor body) as a whole.

Third Embodiment

Hereinafter, the third embodiment of the electrostatic sensor will be described. Further, since the third embodiment has a configuration in which the mark of the first embodiment is modified to be a sealed-type mark, detailed description about the same components as in the first embodiment is omitted.

Figure 5:
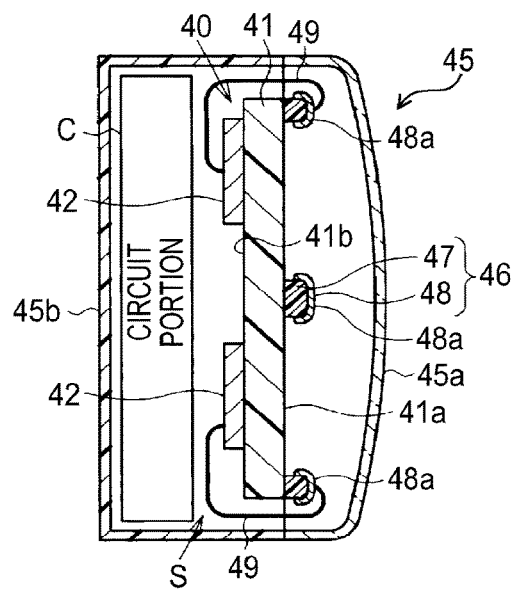
FIG. 5 is a sectional view illustrating a structure of an electrostatic sensor of a third embodiment.

As illustrated in FIG. 5, a sensor body 40 of the present embodiment includes an insulation substrate 41 corresponding to the insulation substrate 15 of the first embodiment. A front surface 41a of the insulation substrate 41 is colored to be black or the like. In addition, in the sensor body 40, four electrodes 42 corresponding to the electrodes 11 to 14 are formed on a back surface 41b of the insulation substrate 41.

Meanwhile, a mark 45 as the attachment target member includes a decoration body 46 having a substantial sun cross shape which adheres to the front surface 41a. The decoration body 46 has a projecting portion 47 formed of, for example, a resin material, which is provided to be upright from the front surface 41a so as to have a shape thereof, and a decoration portion 48 formed of a foil tape made of a conductor, such as a copper foil tape, which is bonded to the projecting portion 47. The decoration portion 48 is configured of a plurality of divided decoration pieces 48a corresponding to the decoration pieces 9a to 9i of the decoration portion 9. Then, the decoration pieces 48a corresponding to the decoration pieces 9f to 9i are short-circuited from the electrodes 42 via a wire 49. Further, the projecting portion 47 may be a single body with the entirety thereof being continuous or may be divided into a plurality of pieces at least to the extent that each of the decoration pieces 48a is not separated.

In addition, the mark 45 has a substantially elliptic cylinder-shaped cover 45a formed of, for example, a transparent resin material (for example, transparent acrylic resin material), which has a lid and is opened toward the front surface 41a, and a substantially elliptic cylinder-shaped case 45b formed of, for example, a resin material, which has a bottom and is opened toward the back surface 41b. In the case 45b, an inner space S which is fitted into the cover 45a and thus is substantially sealed. A circuit portion C is accommodated, along with the sensor body 40 and the decoration body 46, in the inner space S. The circuit portion C configures a part or the entirety of an electric circuit of the control unit 20, for example.

As described above, according to the present embodiment, the following effects are obtained, in addition to the effects (1), and (3) to (8) in the first embodiment and the effect (1) in the second embodiment.

(1) In the present embodiment, the cover 45a formed of a transparent material covers the decoration body 46 along with the front surface 41a of the insulation substrate 41. Hence, in the mark 45, the colored front surface 41a and the metal-tone decoration portion 48 are exposed through the cover 45a, thereby making it possible to enhance design quality.

(2) In the present embodiment, the decoration portion 48 formed of a foil tape made of a conductor is employed, thereby making it possible to dispose the decoration portion 48 on the outermost side in the cover 45a, and making it possible to reduce the detection distance loss while a waterproof property is also ensured.

(3) In the present embodiment, the four electrodes 42 are covered with the colored front surface 41a of the insulation substrate 41, thereby making it possible to improve the external appearance.

(4) In the present embodiment, the inner space S is formed in the mark 45 and the sensor body 40 or the like is accommodated in the inner space, thereby making it possible to enhance, for example, a waterproof performance.

Fourth Embodiment

Hereinafter, the fourth embodiment of the electrostatic sensor will be described. Further, since the fourth embodiment has a configuration in which the mark of the first embodiment is modified, detailed description about the same components as in the first embodiment is omitted.

Figure 6A:
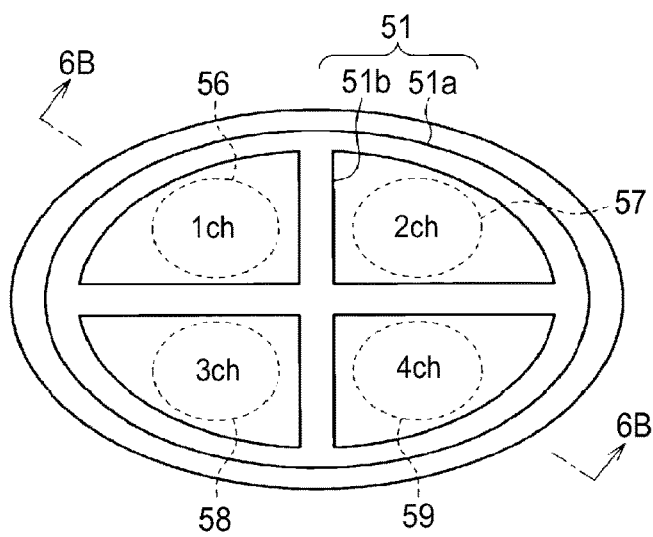
FIG. 6A is a front view illustrating a structure of an electrostatic sensor of a fourth embodiment.
Figure 6B:
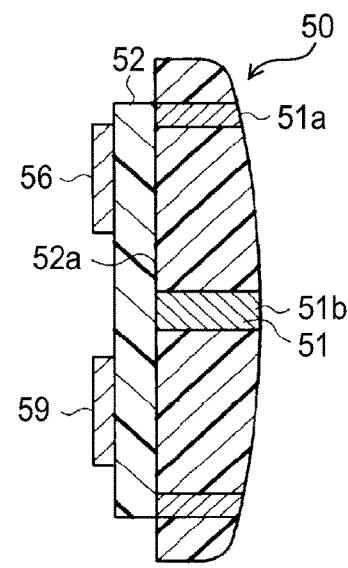
FIG. 6B is a sectional view taken along line 6B-6B in FIG. 6A.

As illustrated in FIGS. 6A and 6B, in a mark 50 as an attachment target member of the present embodiment is formed of, for example, a resin material to have a substantially elliptical plate shape, and a decoration portion 51, which is formed of, for example, a metal material and has a substantial sun cross shape, is embedded. Further, the decoration portion 51 is formed to be a single body with the entirety thereof being continuous, and has a substantially elliptical circumferential wall 51a and a substantially cross-shaped inner wall 51b which is continuous to the inner circumferential surface of the circumferential wall 51a.

Meanwhile, four electrodes 56, 57, 58, and 59 having a substantially elliptic plate shape are formed in four regions partitioned by the decoration portion 51 (the circumferential wall 51a and the inner wall 51b), on a back surface 52a on the side of an insulation substrate 52 corresponding to the insulation substrate 15, which is separated from the mark 50. The four electrodes 56 to 59 form 1 ch to 4 ch, respectively.

The respective electrodes 56 to 59 are arranged in a state of not occupying a space formed by projection of the decoration portion 51 in the plate thickness direction thereof, and thus capacitive coupling of the electrodes with the decoration portion 51 is relatively low. In other words, in the respective electrodes 56 to 59, the occurrence of capacitive coupling of each of the electrodes 56 to 59 via the decoration portion 51 is reduced. In other words, the four electrodes 56 to 59 are arranged such that the decoration portion 51 does not extend across the electrodes.

As described above, according to the present embodiment, the following effects are obtained, in addition to the effects (4) to (8) in the first embodiment.

(1) In the present embodiment, the four electrodes 56 to 59 are not overlapped with the decoration portion 51 at all, and the decoration portion 51 does not also extend across any of the four electrodes 56 to 59. Therefore, it is possible to reduce the occurrence of joining of the four electrodes 56 to 59 via the decoration portion 51, and thus it is possible to reduce the occurrence of having low detection sensitivity of the respective electrodes 56 to 59 to the user' finger H. Hence, it is possible to reliably identify which electrode of the plurality of electrodes 56 to 59 detects the user's finger H.

Further, the embodiment described above may be altered as follows.

Figure 7A:
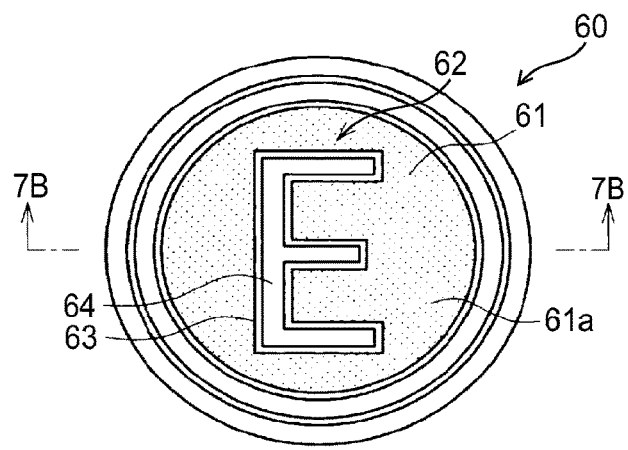
FIG. 7A is a front view illustrating a structure of an electrostatic sensor of a modification embodiment.
Figure 7B:
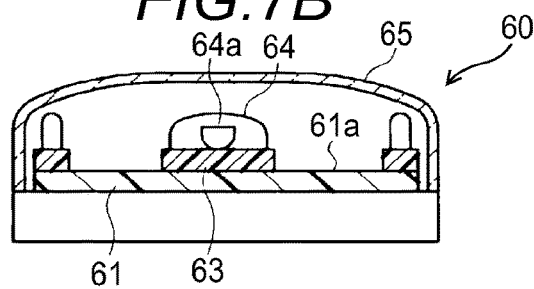
FIG. 7B is a sectional view taken along line 7B-7B in FIG. 7A.

It is considered to employ a mark 60 as illustrated in FIGS. 7A and 7B. In other words, a front surface 61a of an insulation substrate 61 corresponding to the insulation substrate 15 of the first embodiment is colored, for example, to be black (depicted by applying a pattern in FIG. 7A). Then, the mark 60 has a substantially E-shaped decoration body 62 which adheres to the front surface 61a. The decoration body 62 has, for example, a frosted glass-like light guide plate 63 that protrudes from the front surface 61a to have a shape thereof, and decoration 64 that further protrudes to have the shape of the light guide plate 63. A built-in LED 64a for illuminating the light guide plate 63 is provided in the decoration 64. Further, the decoration 64 is formed to be thinner than the light guide plate 63 such that a substantially E-shaped frame is formed in cooperation with the light guide plates 63.

In addition, the mark 60 has a substantially circular cylinder-shaped cover 65 formed of, for example, a transparent resin material (for example, transparent acrylic resin material), which has a lid and is opened toward the front surface 61a. The cover 65 covers the insulation substrate 61 or the like from the front surface 61a side.

Further, a light emitting source (LED 64a) may be disposed in the light guide plate 63 or on a background object (front surface 61a) so as to secure a mounting space. In short, the light emitting source may be present above the background object so as to emit light also to the background object and illuminate the object.

In addition, a filter, which transmits only light having a specific color (frequency) of various types of light or visible light, may be attached to the cover 65 such that the specific color is recognized.

In such a mark 60, the following effects are obtained.

(1) The decoration 64 (decoration body 62) is formed of a three-dimensional structure, and then, when direct sunlight inclined with respect to a perpendicular direction (plate thickness direction of the insulation substrate 61) of the decoration 64 is incident on the decoration, the decoration 64 blocks the sunlight and a shadow is formed on the front surface 61a of the back portion of the decoration. Hence, it is possible to recognize a change in light or a color of light.

(2) The light guide plate 63 is not formed of transparent glass but of frosted glass, the light guide plate 63 becomes white, and the color of the light guide plate is different from the colors of the background object (front surface 61a) or the structure (decoration 64), thereby making it possible for the light guide plate 63 to be stand out vividly. In addition, the background object (front surface 61a) is black, thereby making it possible to more easily recognize the light guide plate 63 (decoration body 62) which is white as a contrasting color to black. In particular, when the color of the light guide plate 63 (decoration body 62) is changed, the light guide plate can be still more easily recognized.

(3) Since the black background object (front surface 61a) absorbs light, it is possible to reduce diffuse reflection (glare) of light reflected from various objects, and a bright color can become vivid against the background object. In other words, it is possible to easily recognize a change in the white light guide plate 63 or the color thereof.

(4) The white light guide plate 63 outstanding in color against the structure (decoration 64) is conspicuous, thereby making it possible for the structure to stand out vividly, and making it possible to more easily recognize the mark 60. In addition, the light guide plate 63 is positioned between the background object (front surface 61a) and the structure (decoration 64), and thereby the bright color can also be more conspicuous against the shadow due to the external light or against the black background.

(5) The light guide plate 63 is formed of frosted glass, and thereby the light from the LED 64a is diffused. Therefore, the light guide plate 63 emits light having an even color, and it is difficult to find the presence of the LED 64a as the light emitting source. Hence, the design quality is not impaired.

(6) The cover 65 formed of a transparent material is disposed on the outer side from the structure (decoration 64), and thereby it is relatively difficult to receive direct sunlight. Then, since an incident direction is limited, it is possible to reduce effects on light emission of the LED 64a.

Figure 8:
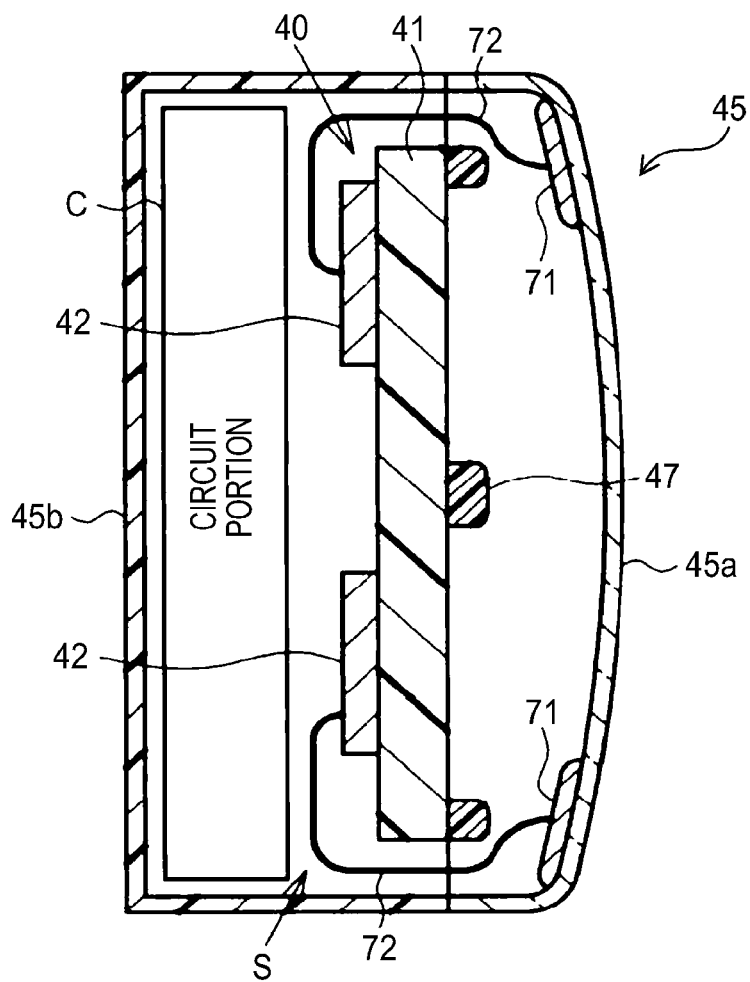
FIG. 8 is a sectional view illustrating a structure of an electrostatic sensor of another modification embodiment.

As illustrated in FIG. 8, the decoration pieces 48a in the third embodiment, which correspond to the decoration pieces 9a to 9e, may be omitted and, instead of the decoration pieces 48a corresponding to decoration pieces 9f to 9i, a plurality of transparent electrodes 71 formed of, for example, ITO may be employed. The respective transparent electrodes 71 are attached to a cover 45a and are short-circuited from the respective electrodes 42 via wires 72.

Such modifications allows the transparent electrodes 71 to be arranged on the outermost side in the cover 45a, and thus it is possible to reduce the detection distance loss while a waterproof property is also ensured, in addition to achieving the effects (1), and (3) to (8) in the first embodiment, the effect (1) in the second embodiment, and the effects (3) and (4) in the third embodiment.

In the third embodiment described above, the decoration portion 48 may be formed of metal deposited on the projecting portion 47.

In the first and fourth embodiments described above, the decoration portions 9 or 51 may be formed of a high dielectric constant resin.

In the first to third embodiments described above, when the decoration portion 9, 30, or 48 is divided so as to reduce the occurrence of joining of the electrodes, a part of each of the decoration portions 9, 30, or 48 may extend across the electrodes.

In the first, second, and fourth embodiments, the case (45b), in which the electrode (sensor body) is accommodated, may be provided.

In the first, second, and fourth embodiments described above, the resin material (a portion in which the decoration portion 9 is not formed), in which the decoration portion 9, 30, or 51 of the mark 8 or 50 is embedded, may be transparent. In this case, the front surface of the insulation substrate exposed through the transparent material may be colored to be, for example, black such that the design quality may be enhanced.

In the first, second, and fourth embodiments described above, the resin material, in which the decoration portion 9, 30, or 51 of the mark 8 or 50 is embedded, may be omitted. In other words, the decoration portion 9, 30, or 51 may be exposed. In this case, the cover (45a) that covers the decoration portion 9, 30, or 51 may be provided.

In the respective embodiments described above, the decoration portion has an arbitrary shape and an arbitrary number of electrodes may be provided on the insulation substrate as long as a plurality of electrodes are provided.

In the respective embodiments described above, the electrodes may be formed by bonding a foil made of a conductor such as a copper foil on the entire insulation substrate, and mechanically or chemically removing an unnecessary portion of the foil. Otherwise, the electrode may be formed by precipitating a pattern formed of a conductor such as copper on the insulation substrate by plating or by attaching the pattern by deposition.

Otherwise, the electrode may be formed by bonding a metal plate such as copper on the insulation substrate.

In the respective embodiments described above, a relationship between a position on the mark at which a user performs the operation with the finger H that comes into contact with or approaches the mark 8, and the corresponding target object may be appropriately modified.

In the respective embodiments described above, the control unit 20 may directly control the drive of the door drive unit 4 or the door lock drive unit 6 without the door ECU 7.

In the respective embodiments described above, monitoring of the detection signal by the control unit 20 may be performed through analog processing or digital processing.

In the respective embodiments described above, functions of the control unit 20 may be realized with a hardware configuration in which, for example, logic circuits are combined.

In the embodiments described above, the attachment target object may be an appropriate position other than the mark 8 of the back door 3, or a swing-type or sliding-type side door (a front door, a rear door, or the like), a trunk lid, a door lock which is disposed in the door or lid, or the like, which is openable and closable electrically. Otherwise, the attachment target object may be a door mirror or a bonnet, a sunroof, a filler cap, or the like, which is electrically openable and closable. Otherwise, the attachment target object may be the body 2 of the vehicle 1 (a rear pillar adjacent to a center pillar or the back door 3), steering, an instrument panel, or the like. Otherwise, the attachment target object may be equipment such as an automatic door disposed in a building or the like or a toilet seat apparatus, a water heater, a power-generating facility, or the like.

In the embodiment described above, the detection target body may be a body (for example, a foot) other than the finger H of the user. Otherwise, the detection target body may be a glove woven with conductive thread, a so-called stylus pen, or the like.

In the embodiment described above, the mark 8 may be an emblem representing a brand, a type, a grade, or the like of vehicle 1. The mark 8 may be arbitrarily formed by a character, graphics, a symbol, a three-dimensional shape, or a combination thereof.

An electrostatic sensor according to an aspect of this disclosure includes: a decoration portion formed of a metal-based material, which is provided in an attachment target member; and a plurality of electrodes that are arranged in a back portion of the decoration portion and that individually detect a detection target which comes into contact with or approaches the decoration portion. The decoration portion is configured of a plurality of decoration pieces divided according to arrangement of the plurality of electrodes.

In this configuration, the decoration portion is divided such that each of the plurality of decoration pieces do not extend across any of the plurality of electrodes, thereby making it possible to reduce the occurrence of joining of the plurality of electrodes, and thus making it possible to reduce the occurrence of having low detection sensitivity of the respective electrodes to the detection target. Hence, it is possible to reliably identify which electrode of the plurality of electrodes detects the detection target.

In the electrostatic sensor, it is preferable that the decoration portion is formed of a metal material, and the plurality of respective electrodes and the decoration pieces divided according to the arrangement of the electrodes are short-circuited from each other.

In this configuration, the respective electrodes can detect the detection target in cooperation with the corresponding short-circuited decoration piece.

In the electrostatic sensor, it is preferable that the plurality of decoration pieces are formed of at least one of a transparent electrode or a foil tape made of a conductor.

According to another aspect of this disclosure, there is provided an electrostatic sensor including: a decoration portion formed of a metal-based material, which is provided in an attachment target member; and a plurality of electrodes that are arranged in a back portion of the decoration portion and that individually detect a detection target which comes into contact with or approaches the decoration portion. The plurality of respective electrodes are arranged in a state in which the electrodes do not occupy a space formed by projection of the decoration portion in a plate thickness direction.

In this configuration, the plurality of electrodes are not overlapped with the decoration portion at all, and the decoration portion does not extend across any of the plurality of electrodes, thereby making it possible to reduce the occurrence of joining of the plurality of electrodes via the decoration portion, and thus making it possible to reduce the occurrence of having low detection sensitivity of the respective electrodes to the detection target. Hence, it is possible to reliably identify which electrode of the plurality of electrodes detects the detection target.

In the electrostatic sensor, it is preferable that the plurality of electrodes are arranged on an insulation substrate.

In the electrostatic sensor, it is preferable that the plurality of electrodes configure different channels, respectively.

The aspect of this disclosure has an effect that it is possible to reliably identify which electrode of the plurality of electrodes detects the detection target.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. An electrostatic sensor comprising:
a decoration portion divided into a plurality of decoration pieces formed of a metal-based material, the plurality of decoration pieces being provided in an attachment target member;
an insulation substrate that is arranged in a back portion in each of the plurality of decoration pieces; and
a plurality of electrodes that are arranged on the insulation substrate and that individually detect a detection target which comes into contact with or approaches the decoration pieces,
wherein the plurality of decoration pieces are divided according to arrangement of the plurality of electrodes, and
wherein the plurality of respective electrodes and the decoration pieces divided according to the arrangement of the electrodes are short-circuited from each other.

2. The electrostatic sensor according to claim 1,
wherein the plurality of decoration pieces are formed of at least one of a transparent electrode or a foil tape made of a conductor.

3. The electrostatic sensor according to claim 1,
wherein the plurality of decoration pieces are provided in an attachment target member,
the plurality of electrodes individually detect a detection target which comes into contact with or approaches the decoration portion, and
wherein the plurality of respective electrodes are arranged in a state in which the electrodes do not occupy a space formed by projection of the decoration portion in a plate thickness direction.

4. The electrostatic sensor according to claim 1,
wherein the plurality of electrodes configure different channels, respectively.

5. The electrostatic sensor according to claim 1,
wherein the plurality of decoration pieces presents a thickness in a thickness direction of the attachment target member, and
wherein the thickness of the plurality of the decoration pieces is equal to a thickness of the attachment target member at a respective location at which a respective decoration piece is provided.

* * * * *